(12) United States Patent
Kim

(10) Patent No.: US 12,339,307 B2
(45) Date of Patent: Jun. 24, 2025

(54) SYSTEM AND METHOD OF DETECTING LEAKAGE OF BATTERY CELL

(71) Applicants: HYUNDAI MOTOR COMPANY, Seoul (KR); KIA CORPORATION, Seoul (KR)

(72) Inventor: Se Hyun Kim, Seoul (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 357 days.

(21) Appl. No.: 18/082,287

(22) Filed: Dec. 15, 2022

(65) Prior Publication Data

US 2023/0417816 A1 Dec. 28, 2023

(30) Foreign Application Priority Data

Jun. 27, 2022 (KR) ........................ 10-2022-0078281

(51) Int. Cl.
*H01H 31/12* (2006.01)
*G01R 31/12* (2020.01)
*G01R 31/16* (2006.01)
*H01M 10/42* (2006.01)
*H01M 50/105* (2021.01)

(52) U.S. Cl.
CPC ......... *G01R 31/16* (2013.01); *G01R 31/1227* (2013.01); *H01M 10/4228* (2013.01); *H01M 50/105* (2021.01)

(58) Field of Classification Search
CPC .. G01R 31/16; G01R 31/1227; G01R 31/367; G01R 31/374; G01R 31/379; G01R 31/382; G01R 31/387; G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679; G01R 27/025

See application file for complete search history.

(56) References Cited

U.S. PATENT DOCUMENTS

| | | | |
|---|---|---|---|
| 6,337,559 B1* | 1/2002 | Sato | H01M 50/574 320/134 |
| 8,359,175 B2 | 1/2013 | Lee et al. | |
| 2012/0019256 A1* | 1/2012 | Lee | G01R 31/385 324/437 |
| 2018/0062210 A1 | 3/2018 | Kim | |
| 2022/0137150 A1* | 5/2022 | Moon | H02J 7/0047 324/427 |
| 2023/0038456 A1* | 2/2023 | Lee | G01R 31/3644 |

(Continued)

FOREIGN PATENT DOCUMENTS

| | | |
|---|---|---|
| JP | 5118936 B2 | 1/2013 |
| KR | 10-1736137 B1 | 5/2017 |
| KR | 2019-0100736 A | 8/2019 |

(Continued)

*Primary Examiner* — Thang X Le
(74) *Attorney, Agent, or Firm* — MCDONNELL BOEHNEN HULBERT & BERGHOFF LLP

(57) ABSTRACT

A system and method of detecting leakage in a pouch-type battery cell includes a press unit configured to position and press the pouch-type battery cell, and a measurement unit configured to measure the insulation resistance of the cell pressed by the press unit.

20 Claims, 8 Drawing Sheets

(56) References Cited

U.S. PATENT DOCUMENTS

2023/0040106 A1\* 2/2023 Youn .................. H01M 10/482
2023/0160967 A1\* 5/2023 Huh ...................... B26D 1/085
29/705

FOREIGN PATENT DOCUMENTS

| KR | 2020-0059618 A | | 5/2020 |
| KR | 10-2146945 B1 | | 8/2020 |
| KR | 10-2173066 B1 | | 11/2020 |
| WO | WO2019164300 | \* | 8/2019 |

\* cited by examiner

FIG. 1("Prior Art")
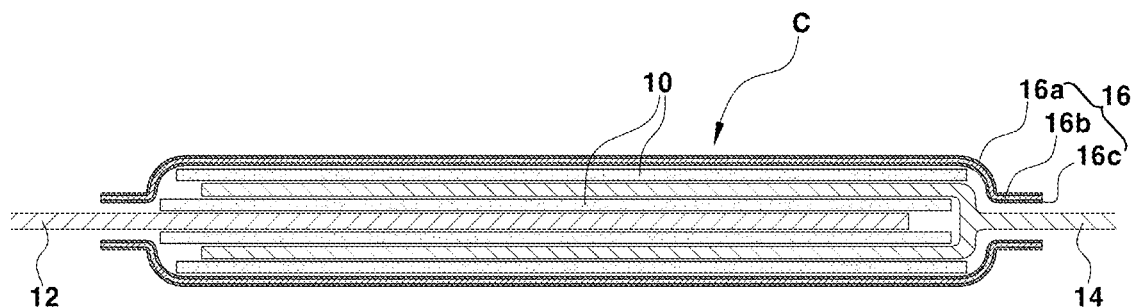
FIG. 2
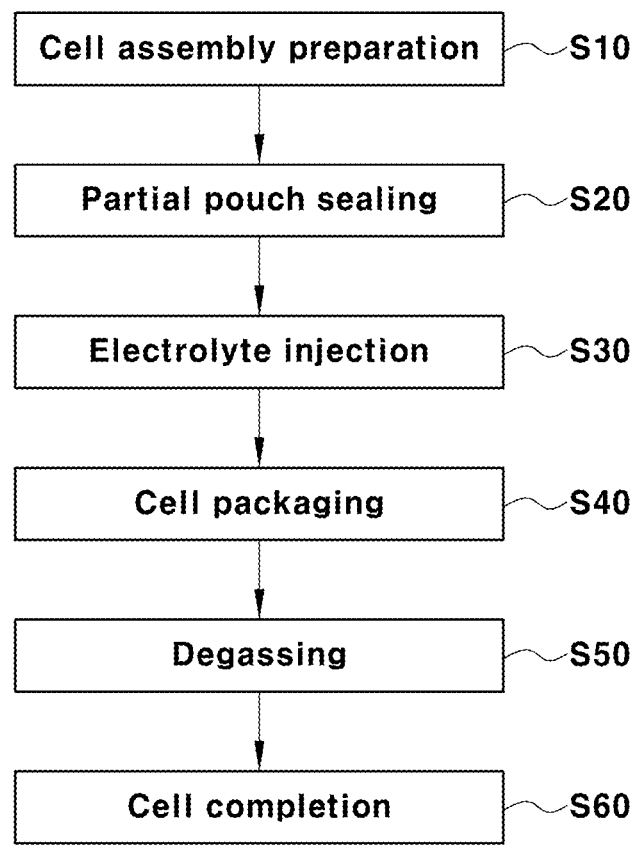

SYSTEM AND METHOD OF DETECTING LEAKAGE OF BATTERY CELL

CROSS REFERENCE TO RELATED APPLICATIONS

The present application claims priority to Korean Patent Application No. 10-2022-0078281, filed on Jun. 27, 2022, the entire contents of which is incorporated herein for all purposes by this reference.

BACKGROUND

Field

The present disclosure relates to detection of leakage of a battery cell and, more particularly, to a system and method of detecting an electrolyte leakage in a pouch-type battery cell.

Description of the Related Art

Recently, with the growth of the electric vehicle market, R&D on rechargeable batteries has been more actively performed than ever. In such a secondary battery, a plurality of cells is assembled into a module, and a plurality of modules is assembled into a battery pack.

A battery cell includes a positive electrode, a negative electrode, a separator, and an electrolyte. The battery cell is packaged with a packaging material. Battery cells may be divided into a pouch type, prismatic type, cylindrical type, and the like according to the type of packaging material.

Among them, the pouch-type battery cell has advantages of high space availability and high energy density, so use thereof is expanding in machines that require a high level of power in a limited space condition, such as a vehicle.

As illustrated in FIG. 1, in the pouch-type battery cell C, a positive electrode 12 and a negative electrode anode 14 separated by a separator 10 are disposed inside a pouch 16. The pouch 16 is composed of an insulating layer of polymer and an aluminum layer. Specifically, the pouch 16 includes an outer insulating layer 16a, an aluminum layer 16b, and an inner insulating layer 16c from the outside of the pouch 16.

The pouch-type battery cell C is manufactured through a cell assembly A formation process and an electrolyte injection process. The cell assembly A is manufactured by stacking the positive electrode 12 and the negative electrode 14 together with the separator 10. Then the cell assembly A is disposed in the pouch 16 of a packaging material, and the pouch 16 is sealed after the electrolyte is injected into the pouch.

Leakage of the liquid electrolyte injected into the cell may occur when the pouch is partially unsealed or the pouch is damaged. If electrolyte leakage occurs, battery life may be reduced or serious consequences may occur in terms of safety, so a test for electrolyte leakage is performed in the cell manufacturing process.

In this test, a method of measuring a sealing thickness of a pouch at a specific location of a cell within a packaging process or measuring the insulation resistance of the negative electrode and the aluminum layer of the pouch during the end of line test (EOL test) for a final cell is used.

SUMMARY

The present disclosure has been made in an effort to solve the above-described problem associated with the related art, and an objective of the present disclosure is to provide a system for detecting leakage in a pouch-type battery cell for effectively detecting a sealing defect of the pouch-type battery cell.

The objective of the present disclosure is not limited to the aforementioned objectives, and the other objectives not mentioned may be clearly understood by those with ordinary skill in the art to which the present disclosure pertains (hereinafter "those skilled in the art") from the following description.

The features of the present disclosure for achieving the objectives of the present disclosure, and performing the characteristic functions of the present disclosure to be described later are as follows below.

According to an aspect of the present disclosure, there is provided a system for detecting leakage in a pouch-type battery cell, the system including: a press unit configured to position and press the pouch-type battery cell; and a measurement unit configured to measure the insulation resistance of the cell pressed by the press unit.

According to another aspect of the present disclosure, there is provided a method of detecting leakage in a pouch-type battery cell, the method including: pressing the pouch-type battery cell by a press unit; measuring the insulation resistance of the cell during pressing of the cell by a measurement unit; and determining leakage of an electrolyte in the cell on the basis of the insulation resistance by a controller configured to communicate with the measurement unit.

According to the present disclosure, in the system for detecting leakage in the pouch-type battery cell, the leakage of an electrolyte is detected in a state in which a pressing force is applied to the battery cell so that a sealing failure can be effectively detected even when there is a slight defect in a sealed part.

The effects of the present disclosure are not limited to those described above, and other effects not mentioned will be clearly recognized by those skilled in the art from the following description.

BRIEF DESCRIPTION OF THE FIGURES

FIG. 1 schematically illustrates a cross-section of a pouch-type battery cell;

FIG. 2 is a flowchart illustrating a process of manufacturing the pouch-type battery cell;

DETAILED DESCRIPTION

Figure 3A:
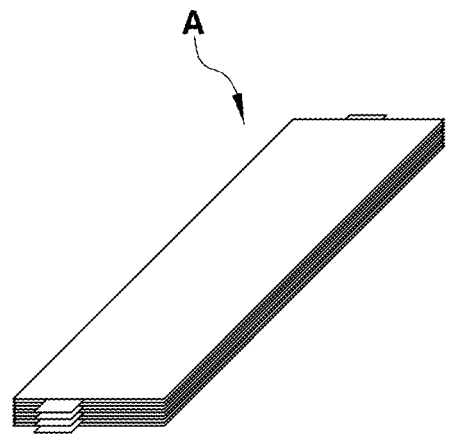
FIGS. 3A, 3B, 3C, 3D, 3E, and 3F are views showing a manufacturing process of the pouch-type battery cell.
Figure 3B:
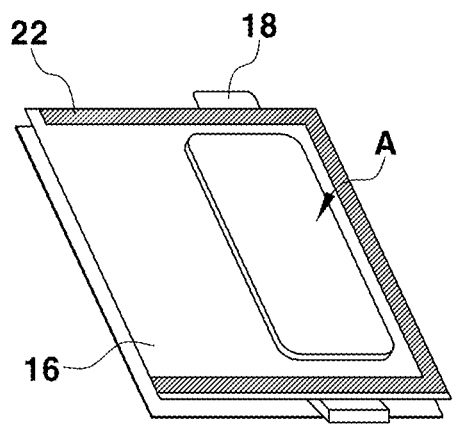

Specific structural or functional descriptions presented in exemplary embodiments of the present disclosure are only exemplified for the purpose of describing the exemplary embodiments according to the concept of the present disclosure, and the exemplary embodiments according to the concept of the present disclosure may be carried out in various forms. Further, the exemplary embodiments should not be interpreted as being limited to the exemplary embodiments described in the present specification, and should be understood as including all modifications, equivalents, and substitutes included in the spirit and scope of the present disclosure.

Meanwhile, in the present disclosure, terms such as first and/or second may be used to describe various components, but the components are not limited to the terms. The terms are used only for the purpose of distinguishing one component from other components. For example, a first component may be referred to as a second component, and similarly, the second component may also be referred to as the first component, without departing from the scope according to the concept of the present disclosure.

When a component is referred to as being "connected" or "coupled" to another component, it should be understood that the components may be directly connected or coupled to each other, but still other component may also exist therebetween. On the other hand, when a component is referred to as being "directly connected to" or "in direct contact with" another component, it should be understood that there is no other component therebetween. Other expressions for describing the relationship between components, that is, expressions such as "between" and "directly between" or "adjacent to" and "directly adjacent to" should be also interpreted in the same manner.

Throughout the specification, the same reference numerals refer to the same elements. Meanwhile, the terms used in the present specification are for the purpose of describing the exemplary embodiments and are not intended to limit the present disclosure. In the present specification, the singular form also includes the plural form unless otherwise specified in the phrase. "Comprises" and/or "comprising" used in the specification specifies the presence of the mentioned component, step, operation, and/or element, and does not exclude the presence or the addition of one or more other components, steps, operations, and/or elements.

Hereinafter, the present disclosure will be described in detail with reference to the accompanying drawings.

A manufacturing process of a pouch-type battery cell C will be described with reference to FIG. 2 and FIGS. 3A to 3F. A positive electrode 12, a negative electrode 14, and a separator 10 are stacked to assemble into a cell assembly A (S10, FIG. 3A). The cell assembly A is then disposed inside a pouch 16 including an aluminum layer 16b and insulating layers 16a, 16c. Electrode tabs 18 of the positive electrode 12 and the negative electrode 14 are disposed to protrude outward from the pouch 16. Then an initial sealing portion 22 is sealed except for a temporary opening portion 20 of the pouch 16 (S20, FIG. 3B).

Figure 3C:
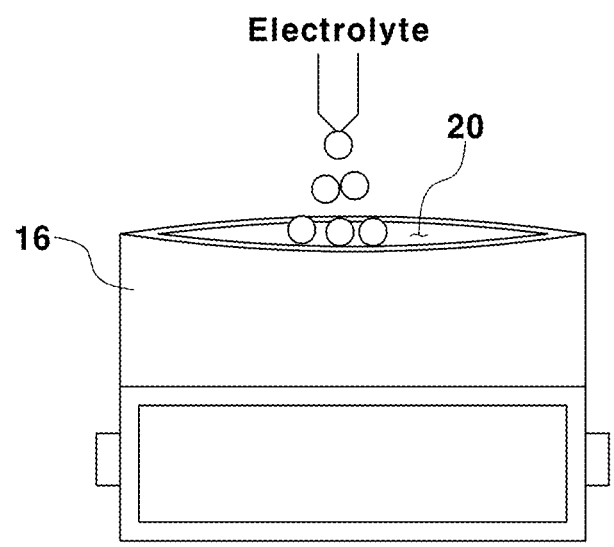
Figure 3D:
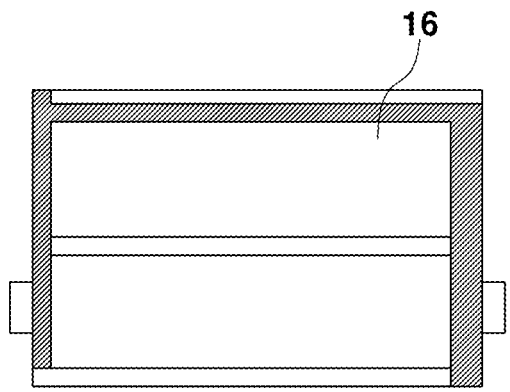

An electrolyte is injected into the pouch 16 through the temporary opening portion 20 (S30, FIG. 3C). After the electrolyte is injected into the pouch 16, the entire periphery of the pouch 16 is sealed by sealing the temporary opening portion 20 of the pouch 16 (S40, FIG. 3D).

Figure 3E:
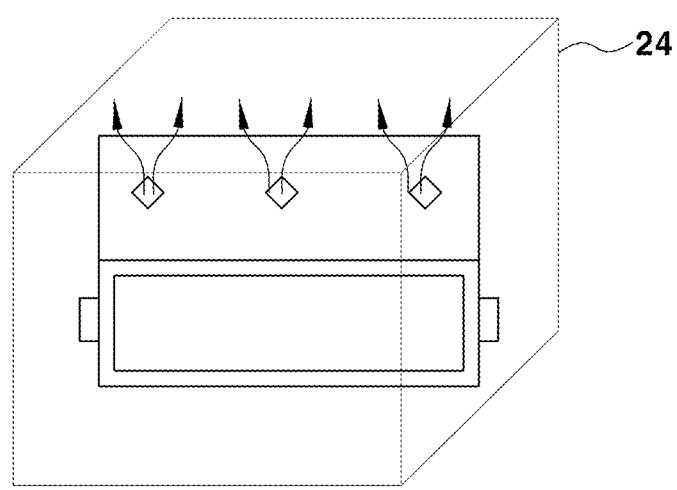

In case of the pouch-type battery cell C, unlike other types of cells, a degassing process is performed (S50, FIG. 3E). In the degassing process, a gas pocket of the pouch 16 is perforated to remove gases present in the pouch 16 or the electrolyte in a vacuum chamber 24, leading to a vacuum state in the pouch 16.

Figure 3F:
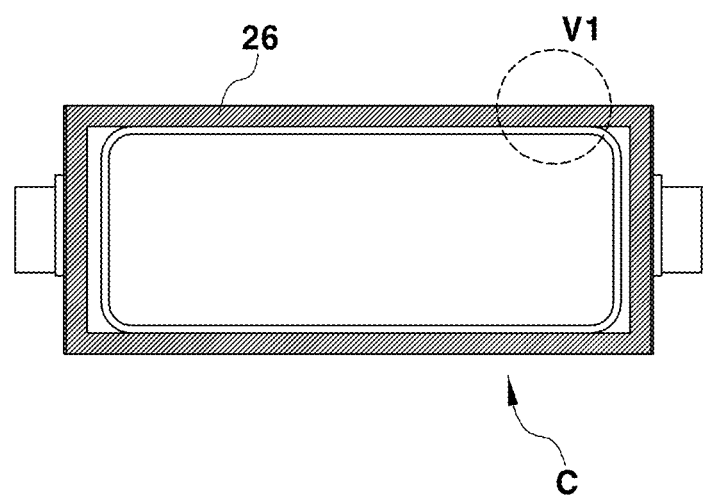

The degassed cell C is trimmed and sealed according to a preset size to obtain a completed cell C (S60, FIG. 3F).

The completed cell C is subjected to an EOL inspection process, which is a final process. In this process, cell characteristics, such as voltage, resistance, dimension, and insulation resistance of the cell, are finally inspected, and defective cells C can be identified. In this process, it is determined whether the pouch 16 has a sealing defect, which can be determined through measurements of insulation resistance. Specifically, by measuring the insulation resistance between the negative electrode tab, which is one of the electrode tabs 18 of the cell C, and the aluminum layer 16b of the pouch 16, the sealing defect is determined based on the measured insulation resistance.

However, the insulation resistance measurement is valid only when the electrolyte flows out of the pouch 16 and comes into contact with the aluminum layer 16b of the pouch 16.

Figure 4A:
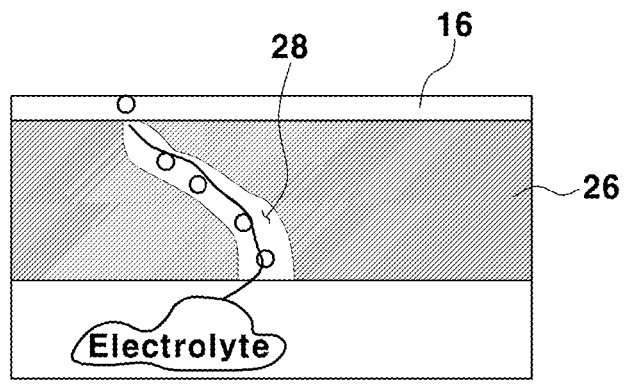
FIG. 4A is an enlarged perspective view of FIG. 3F, showing the case in which a damaged path in a sealing surface of the pouch-type battery cell is large.
Figure 4B:
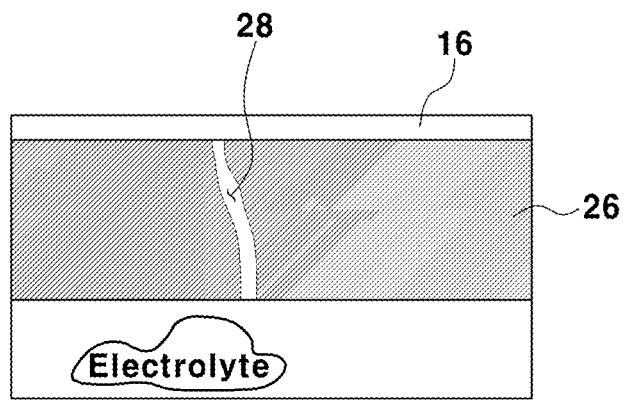
FIG. 4B is an enlarged perspective view of FIG. 3F, showing the case in which a damaged path in a sealing surface of the pouch-type battery cell is fine.

Specifically, it is possible to determine the sealing defect only when the area of the portion having a problem with sealing on the sealing surface 26 is large as illustrated in FIG. 4A so that the electrolyte inside the pouch 16 is brought into contact with the aluminum layer 16b at the periphery of the pouch 16 along a damaged path 28. Conversely, as illustrated in FIG. 4B, when the area of the damaged path 28 is subtle, the electrolyte does not flow to the outside due to the degree of vacuum inside the cell C even though the damaged path 28 exists. That is, at this time, the internal vacuum degree of the cell C is maintained and the pressure difference between the inside and the outside of the cell C is maintained. Accordingly, that the electrolyte hardly leaks to the outside in a situation where the damaged path 28 is minute. In the latter case, a defect is not detected during the EOL inspection. Instead, the vacuum degree inside the cell is destroyed by an external force during actual use, and an electrolyte leakage may occur in the cell C.

Accordingly, the present disclosure is intended to provide leakage detection system for a pouch-type battery cell capable of determining whether an electrolyte has leaked by inducing leakage in a manufacturing process if it is difficult to detect an electrolyte leakage as in the latter case.

In particular, the present disclosure provides a system and method configured to measure the insulation resistance while pressing the cell C such that the leakage of the electrolyte or the insulation can be determined even when the unsealed portion is minute.

Figure 5:
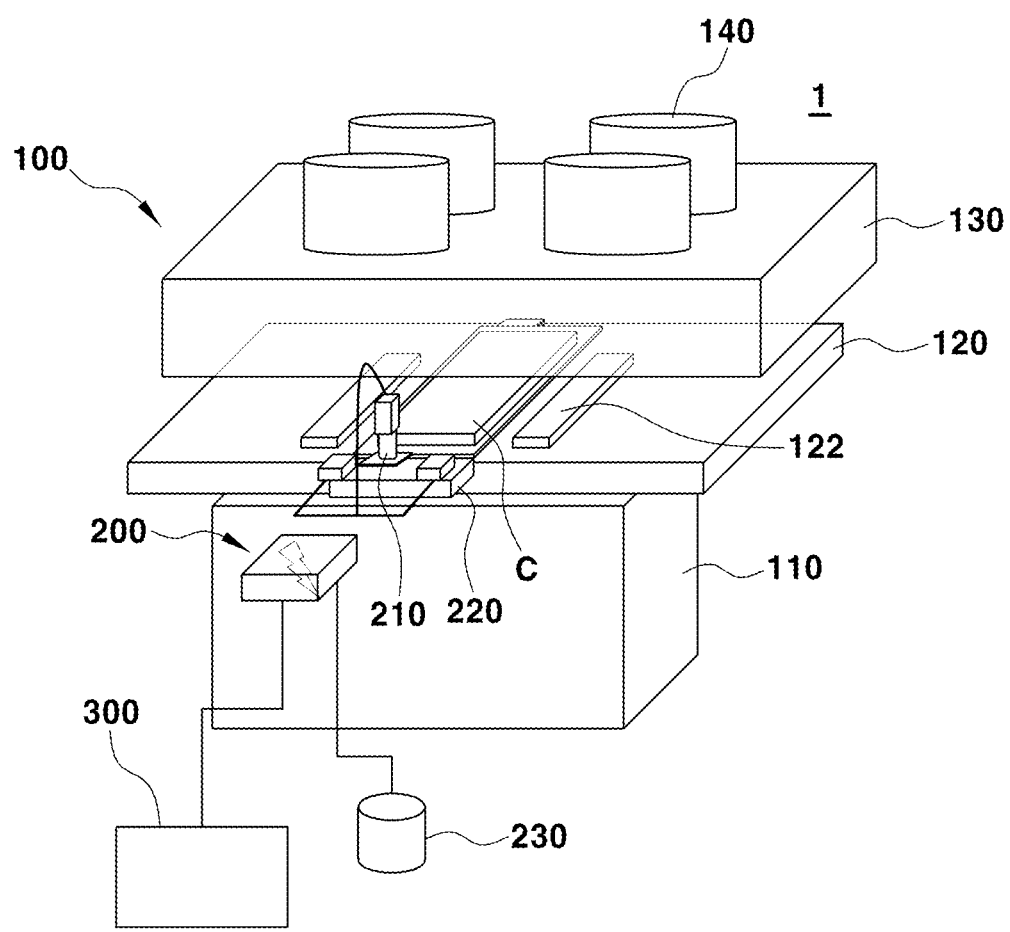
FIG. 5 illustrates leakage detection system of a pouch-type battery cell according to some embodiments of the present disclosure.

As illustrated in FIG. 5, according to an embodiment of the present disclosure, the leakage detection system 1 of a pouch-type battery cell includes a press unit 100 and a measurement unit 200.

The press unit 100 is configured to press the cell C during measurement of the insulation resistance of the cell C. In some embodiments, the press unit 100 may use a pressing device used during the EOL inspection process. During the EOL inspection process, the thickness of the cell C is measured. At this time, the cell C is required to be pressed, so a pressing device is used. The present disclosure can avoid the cost required for a separate pressing device for detecting an electrolyte leakage. In some embodiments, the press unit 100 may be provided as a separate device from the pressure device for measuring the thickness.

According to an embodiment of the present disclosure, the press unit 100 may include a base 110, a fixed plate 120, and a moving plate 130.

The base 110 is fixed. The fixed plate 120 is mounted on the base 110. The moving plate 130 is disposed to face the fixed plate 120. The moving plate 130 is configured to be movable with respect to the fixed plate 120. Specifically, the moving plate 130 is disposed to be movable toward or away from the fixed plate 120.

The moving plate 130 is provided with a moving force from an actuator 140. According to some embodiments of the present disclosure, the actuator may be one or more pneumatic cylinders. According to some embodiments of the present disclosure, the actuator may be an electric linear actuator. The actuator 140 is not limited to these examples, and other known actuators may be used.

The fixed plate 120 may be provided with positioning blocks 122. The positioning blocks 122 may allow the cell C to be positioned at a measurement position M1 that is a correct position in the press unit 100. The positioning blocks 122 are mounted on the fixed plate 120 to be movable with respect to the fixed plate 120. The positioning blocks 122 are provided on both sides of the fixed plate 120 with respect to the measurement position M1 to adjust or fix the position of the cell C placed at the measurement position M1. The positioning blocks are configured to hold the cell C at the measurement position M1 by movement toward the cell C. For example, the positioning blocks 122 may be moved on the fixed plate 120 by receiving a driving force from an electric linear rail, an electric cylinder, or the like. After positioning the cell C at the correct measurement position M1, the positioning blocks 122 may return to the original position. However, in some embodiments, the positioning blocks 122 may be in a state of holding the cell C at the measurement position M1 when the press unit 100 performs the pressing.

The measurement unit 200 is configured to measure the insulation resistance of the cell C during pressing of the cell C. The measurement unit 200 is configured to be able to access the pressed cell C in the press unit 100. In some embodiments, the measurement unit 200 may be mounted on a conveyor 230 to allow the measurement unit to be moved from the outside of the press unit 100 toward the press unit 100. As a non-limiting example, the conveyor may be an electric cylinder. The measurement unit 200 may include a probe 210 and a support 220.

The measurement unit 200 includes at least one pair of probes 210. One of the pair of probes 210 is in contact with the aluminum layer 16b of the cell C. The other of the pair of probes 210 is in contact with the electrode tab 18 or the negative electrode tab of the cell C. When the pair of probes 210 are in contact with the measurement unit 200, the insulation resistance of the cell C may be measured.

According to some embodiments of the present disclosure, one backup probe 212 may be further included. The backup probe 212 may function as a backup when the probe 210 in contact with the aluminum layer 16b among the pair of probes 210 fails to contact with the aluminum layer 16b.

The controller 300 is configured to communicate with the press unit 100 and the measurement unit 200 to control their operations. The controller 300 operates the actuator 140 according to the inspection request so that the cell C is pressed, and the insulation resistance of the cell C is measured by the measurement unit 200. Also, the controller 300 may receive the measurement result from the measurement unit 200 and determine whether the cell C is defective based thereon.

The support 220 is configured to be movable by the conveyor 230 of the measurement unit 200. The support 220 is configured to support one of the pair of probes that is in contact with the aluminum layer 16b and the backup probe 212 during measurement. The support 220 is configured to move the probe 200 and the backup probe 212 toward the cell C at the measurement position M1 of the press unit 100. Conversely, when the measurement is finished, the support 220 is configured to move in a direction away from the cell C.

Figure 6:
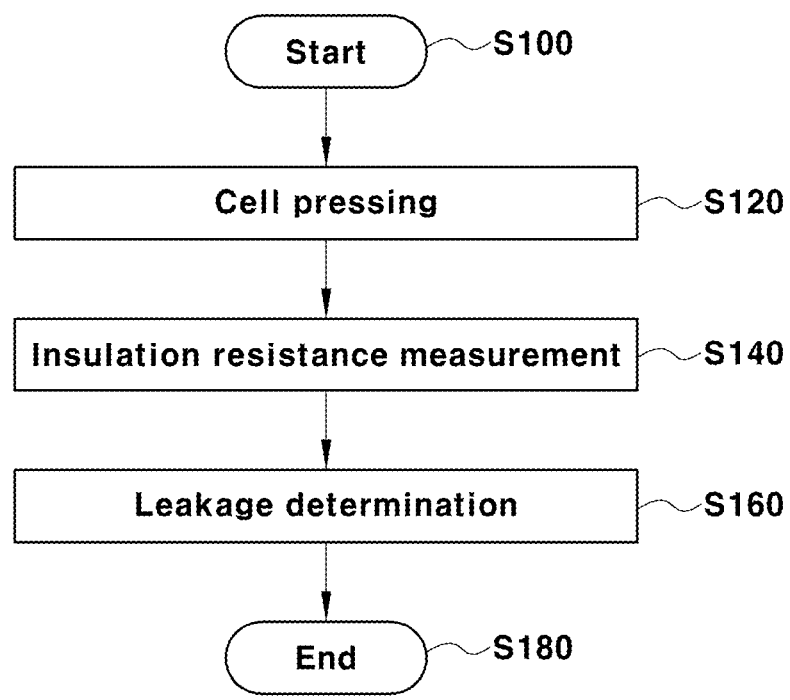
FIG. 6 is a flowchart illustrating a method of detecting leakage in a pouch-type battery cell according to some embodiments of the present disclosure.

Referring to FIG. 6, according to some embodiments of the present disclosure, the electrolyte leakage may be determined by the controller 300 through the following steps.

In step S100, the electrolyte leakage determination is started.

In step S120, a test target cell C is pressed. The cell C may be pressed by the press unit 100. The cell C is pressed with a preset pressing force. As a non-limiting example, the pressing force is selected to be a value of 90 kilogram-force (kgf) or more, and may be pressed to approximately 120 kgf. In order to more accurately detect the electrolyte leakage, according to the present disclosure, the electrolyte leakage may be induced even through the minute damaged path 28 with the pressing of the cell C during measurement. Further, the pressing force may be changed from a small value to a large value step by step.

In step S140, the insulation resistance of the cell C under press is measured. The insulation resistance of the cell C may be measured by making the probes 210 of the measurement unit 200 contact the negative electrode tab of the cell C and the aluminum layer 16b, respectively.

In step S160, it is determined whether the electrolyte of the tested cell C has a leak. The controller 300 is configured to receive a measurement result from the measurement unit 200. The controller 300 is configured to determine that there is no electrolyte leakage when the measured value is greater than or equal to a preset value. The controller 300 is configured to determine an abnormal cell with electrolyte leakage when the measured value is less than a preset value.

Then leakage detection is finished in step S180.

Figure 7:
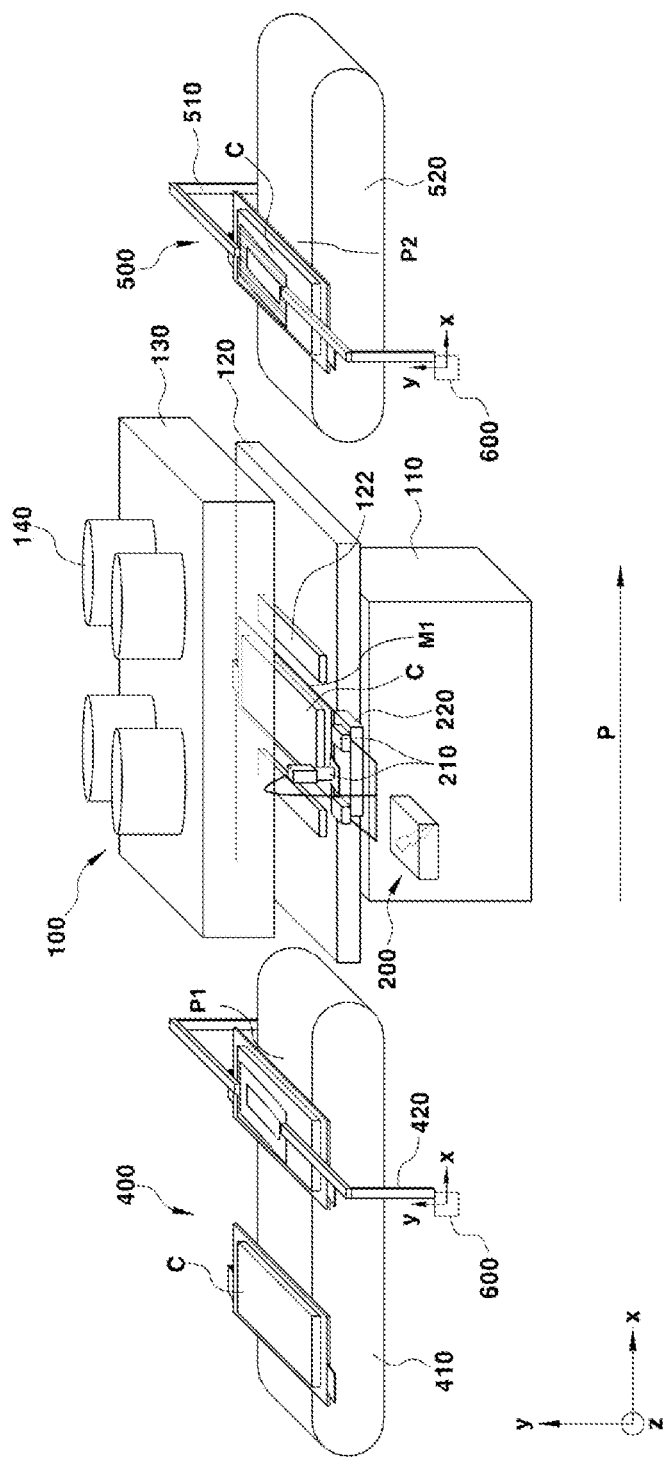
FIG. 7 illustrates leakage detection system of a pouch-type battery cell according to some embodiments of the present disclosure.

As illustrated in FIG. 7, according to some embodiments of the present disclosure, the system 1 may further include at least one of an input unit 400 and an output unit 500. The input unit 400 may be configured to transport the cell C to the measurement position M1 of the press unit 100. The output unit 500 may transport the cell C at the measurement position M1 to the outside of the press unit 100. Accordingly, the input unit 400 and the output unit 500 may enable automation of leakage detection.

According to an embodiment of the present disclosure, the input unit 400 includes an inlet line 410 and a loader 420. The inlet line 410 is configured to sequentially transfer a plurality of cells C to be inspected to a loading position P1. According to an embodiment of the present disclosure, the inlet line 410 may be a conveyor belt. The inlet line 410 is configured to operate at a preset rotation speed so that the cells C on the inlet line 410 can come to the loading position P1 at a certain time interval or discretely. The cells C are disposed to be spaced apart at a certain interval from each other in the inlet line 410.

The loader 420 is configured to transport the cell C that has reached the loading position P1 of the inlet line 410 to the measurement position M1. The loader 420 may lift the cell C at the loading position P1 in a manner of gripping, adsorption, or the like, and move the lifted cell to the measurement position M1. According to one embodiment of the present disclosure, the loader 420 may move the cell C to the measurement position M1 through vacuum adsorption of the cell C. According to another embodiment of the present invention, the loader 420 may include a gripper capable of gripping the cell.

The output unit 500 is configured to move the cell C placed on the press unit 100, specifically at the measurement position M1 of the press unit 100, to the outside of the press unit 100. According to the measurement result of the measurement unit 200, the output unit 500 may send defective cells to a defective cell collection station and normal cells to the next process. According to an embodiment of the present disclosure, the output unit 500 includes an unloader 510 and an outlet line 520.

The unloader 510 may perform a function similar to that of the loader 420. The unloader 510 is configured to move the cell C at the measurement position M1 to the unloading position P2 on the outlet line 520. The unloader 510 may lift the cell C at the measurement position M1 in a manner of gripping, adsorption, or the like and transport the lifted cell to the unloading position P2. According to an embodiment of the present disclosure, the unloader 510 may vacuum-adsorb the cell C and transport the cell from the measurement position M1 to the unloading position P2.

The outlet line 520 may operate continuously to transport the cells C inspected and placed at the unloading position P2 at a certain time interval to the next destination. The outlet line 520 is configured to operate at a predetermined rotational speed so that the cells C at the unloading position P2 are transported at a certain time interval or discretely. According to an embodiment of the present disclosure, the outlet line 520 may be a conveyor belt.

The loader 420 and the unloader 510 may be configured to be movable along a progress direction P or an x-axis of the detection process by a carrier 600. For example, the carrier 600 may be an electric linear guide. In addition, cell C holder portions of the loader 420 and the unloader 510 may be configured to be movable along a y-axis. Accordingly, the loader 420 and the unloader 510 may move toward the cell C when adsorbing or holding the cell C.

According to an embodiment of the present disclosure, the measurement unit 200 may be configured to be movable. The measurement unit 200 may be mounted on the conveyor 230 to be movable in a z-axis direction. While the cell C is pressed by the press unit 100, the measurement unit 200 including the probes 210 may advance toward the press unit 100 to measure the insulation resistance of the cell C.

According to some embodiments of the present disclosure, the loader 420 and the unloader 510 may be operated based on measurements by a sensor configured to detect the presence or absence of the cell C at the loading position P1, the unloading position P2, or the measurement position M1, respectively. The measurements of the sensor may be transmitted to the controller 300. When the cell C is detected by the sensor, the loader 420 or the unloader 510 is configured to adsorb the cell C. As a non-limiting example, the sensor may be a displacement sensor.

Figure 8:
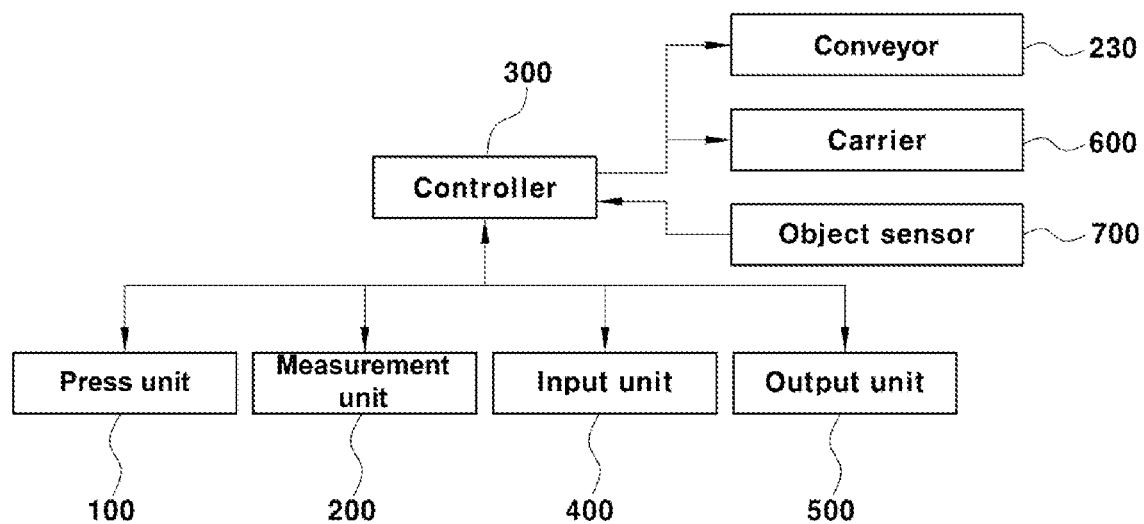
FIG. 8 is a block diagram illustrating the leakage detection system of the pouch-type battery cell according to some embodiments of the present disclosure.

Referring to FIG. 8, according to some embodiments of the present disclosure, an object sensor 700 may be further included. The object sensor 700 is configured to detect the presence of an object at a specific location. A plurality of object sensors 700 may be disposed in the system 1 to allow the loader 420, the unloader 510, the press unit 100, and the like to determine the position of the cell C. For example, an object sensor 700 capable of determining whether the cell C is disposed at the loading position P1 may be disposed in the input unit 400. The object sensor 700 may be provided at a fixed portion of the inlet line 410 or at the loader 420. As a non-limiting example, an object sensor 700 capable of detecting whether the cell C is disposed at an unloading position P2 may be provided at the output unit 500. As another non-limiting example, the press unit 100 may include an object sensor 700. The object sensor 700 of the press unit 100 may determine whether the cell C is placed at the measurement position M1. According to an embodiment of the present disclosure, the object sensor 700 includes a laser displacement sensor capable of detecting the presence or absence of a cell.

According to some embodiments of the present disclosure, the loader 420 and the unloader 510 include a pneumatic sensor. When the cell C is not adsorbed or incompletely adsorbed by the loader 420 or the unloader 510 at the measurement position M1, the loading position P1 or the pressing position, the pneumatic sensor may transmit information about such as a pneumatic measurement failure, insufficient pneumatic measurement value, or the like to the controller 300, which may in turn enable the operator to recognize such situations through an audiovisual display including a notification, for example.

Additionally, the controller 300 may automate the leakage detection process. The controller 300 may be configured to communicate with at least some or all of the press unit 100, the measurement unit 200, the input unit 400, and the output unit 500 to control the operation of at least some of them. Specifically, the controller 300 may operate respective units of the system 1 on the basis of commands stored in advance as follows.

In the inlet line 410 of the input unit 400, a series of cells C to be inspected are supplied to the loading position P1 in a spaced-apart manner. The controller 300 operates the loader 420 and the carrier 600. Specifically, a holder portion of the loader 420 descends in the y-axis direction to hold the cell C at the loading position P1 and rises again. The loader 420 holding the cell C moves to the press unit 100. The loader 420 moves in the x-axis direction by the carrier 600 to position the cell C at the measurement position M1 of the press unit 100. Then the loader 420 returns to the original position, which is the loading position P1.

The positioning blocks 122 of the press unit 100 are configured to adjust the cell C to be positioned correctly at the measurement position M1. Here, the movement of the positioning blocks 122 may be controlled by the controller 300. When it is determined by the controller 300 (via the object sensor 700, etc.) that the cell C is in the measurement position M1, the controller 300 drives the actuator 140 of the press unit 100 to lower the moving plate 130 so that the cell C is pressed with a preset pressing force.

At this time, that is, during the pressing by the press unit 100, the controller 300 drives the conveyor 220 to move the measurement unit 200 toward the press unit 100. One of the probes 210 comes into contact with the electrode tab 18, and the other of the probes 210 comes into contact with the aluminum layer 16*b*. When the contact is completed, the measurement unit 200 measures the insulation resistance. The measured insulation resistance is transmitted to the controller 300. The controller 300 determines whether the electrolyte leaks in the cell C on the basis of the received measurement result.

When the measurement is finished, the controller 300 drives the actuator 140 so that the moving plate 130 is lifted. After the moving plate 130 is lifted, the unloader 510 at the unloading position P2 is moved in the x-axis direction toward the measurement position M1 by the carrier 600. The holder portion of the unloader 510 descends and holds the cell C at the measurement position M1, and returns to the unloading position P2 by the action of the carrier 600. Then the unloader 510 puts the inspected cell C on the outlet line 520 at the unloading position P2. As the outlet line 520 moves, the inspected cell C moves to a destination determined depending on whether or not there is a defect.

According to some embodiments of the present disclosure, the controller 300 may adjust the pressing force of the press unit 100. The required pressure may vary depending on the area or size of the damaged path 28, that is, depending on the fineness of the damaged path 28. The controller 300 may allow the cell C to be pressed while changing the pressing force from a small value to a high value so that an unnecessarily large pressure is not applied during detection, and the leakage of the cell C can be more reliably detected.

Specifically, the controller 300 controls the press unit 100 to apply a first force so that the cell C at the measurement position M1 is pressed. The first force may be a preset minimum pressure value. As a non-limiting example, the preset minimum pressure value may be 90 kgf. While allowing for the application of the first force, the controller 300 enables the measurement unit 200 to measure the insulation resistance. If the insulation resistance is not normal, the controller 300 treats the cell C as a defective cell without additional measurement. If the insulation resistance is normal, the controller 300 may additionally perform the measurement.

The controller 300 enables the press unit 100 to apply a second force greater than the first force to the cell C. For example, the second force may be 120 kgf. While allowing for the application of the second force, the controller 300 controls the measurement unit 200 to measure the insulation resistance. If the insulation resistance is not normal, the controller 300 determines that the corresponding cell C is defective without additional measurement. Conversely, if the insulation resistance is normal, an additional measurement may be performed with a third force greater than the second force. The controller 300 may gradually repeat the pressing and measurement up to the maximum pressure permitted in the cell C.

The present disclosure makes it possible to secure the safety of a battery by improving the reliability of the electrolyte leakage test of the battery. According to the present disclosure, if it is difficult to detect an electrolyte leakage because an electrolyte does not leak even though there is an unsealed portion in the pouch-type battery cell, leakage is induced by applying pressure to the cell during detection. This makes it possible to reliably detect the leakage of a flammable electrolyte of a lithium ion battery in a manufacturing process. According to the present invention, the ignition of a battery can be prevented in advance even when a battery having a sealing defect is sent out to the field of operations due to failure to detection.

The present disclosure can prevent a decrease in productivity by introducing an additional inspection process. The pressing device does not need to allocate a separate process time or configure a stage by using a pressing device for thickness inspection of a cell in the EOL inspection process. Accordingly, it is possible to reduce the investment cost and process time for a separate pressing apparatus.

In addition, the present disclosure is effective as it enables automated inspection of continuously supplied cells.

The detection system and method according to the present disclosure can be applied to any pouch regardless of the small or large size of the pouch. The detection system and method can be applied not only to small pouch-type battery cells for portable electronic devices, such as smartphones, laptops, and tablets but also to mid-to-large pouch-type battery cells for applications, such as electric vehicles.

The aforementioned present disclosure is not limited by the aforementioned exemplary embodiments and the accompanying drawings, and it will be apparent to those skilled in the art that various substitutions, modifications, and changes may be made without departing the technical sprit of the present disclosure.

The invention claimed is:

1. A system for determining leakage in a pouch-type battery cell, the system comprising:
   a press unit configured to position and press the pouch-type battery cell;
   a measurement unit configured to measure insulation resistance of the cell pressed by the press unit; and
   a controller configured to determine the leakage in the pouch-typed battery cell based on the measured insulation resistance;
   wherein the pouch-type battery cell includes a sealing surface sealing a pouch of the pouch-type battery cell, wherein the sealing surface extends from at least a portion of the pouch in a first direction and includes a thickness in a second direction, wherein the press unit is configured to press a surface of the pouch along the second direction.

2. The system of claim 1, wherein the press unit comprises:
   a fixed plate including a measurement position in which the cell is located; and
   a moving plate configured to be movable with respect to the fixed plate.

3. The system of claim 2, wherein the press unit further comprises an actuator configured to provide a moving force to the moving plate.

4. The system of claim 1, wherein the measurement unit comprises at least one pair of probes configured to measure the insulation resistance of the cell, wherein the at least one pair of probes comprises a first probe and a second probe.

5. The system of claim 4, wherein the first probe comes into contact with an aluminum layer of the cell and the second probe comes into contact with a negative electrode of the cell during the measurement of the insulation resistance.

6. The system of claim 5, wherein the measurement unit further comprises a backup probe, wherein the backup probe is configured to come into contact with the aluminum layer of the cell together with the first probe.

7. The system of claim 1, further comprising an input unit configured to transport the cell to the press unit.

8. The system of claim 7, wherein the input unit comprises:
   an inlet line configured to move the cell to a loading position; and
   a loader configured to hold the cell at the loading position and transport the cell at the loading position to the measurement position in the press unit.

9. The system of claim 7, wherein the input unit is configured to supply a plurality of pouch-type cells to the press unit at a certain time interval.

10. The system of claim 1, further comprising an output unit configured to transfer the cell to the outside of the press unit.

11. The system of claim 10, wherein the output unit comprises:
    an unloader configured to move the cell in the press unit to an unloading position; and
    an outlet line including the unloading position and configured to carry the cell to a preset position.

12. The system of claim 3, further comprising a positioning block provided in the press unit and configured to adjust the position of the cell located at the measurement position.

13. A method of determining leakage in a pouch-type battery cell, the method comprising a plurality of steps executable by a controller including:
   determining whether a cell is positioned at a loading position of an input unit configured to transfer the cell to a press unit;
   instructing a loader of the input unit to lift the cell in response to the cell being at the loading position;
   instructing the loader to transport the cell to a measurement position of the press unit in response to the cell being lifted;
   instructing the press unit to press the cell at the measurement position with a preset force in response to the cell being located at the measurement position;
   instructing a measurement unit to measure the insulation resistance of the cell during pressing; and
   determining leakage of an electrolyte in the cell on the basis of the measured insulation resistance;
   wherein the pouch-type battery cell includes a sealing surface sealing a pouch of the pouch-type battery cell, wherein the sealing surface extends from at least a portion of the pouch in a first direction and includes a thickness in a second direction, wherein the press unit is configured to press a surface of the pouch along the second direction.

14. The method of claim 13, wherein the cell at the measurement position is adjusted in the position of the measurement position by the positioning block provided in the press unit.

15. The method of claim 13, further comprising:
   instructing an unloader of an output unit configured to transport the cell at the measurement position to lift the cell at the measurement position;
   instructing the unloader to move the cell to an unloading position of the output unit in response to the cell being lifted; and
   driving an outlet line of the output unit in response to the cell being moved to the unloading position.

16. A method of determining leakage in a pouch-type battery cell, the method comprising:
   pressing the pouch-type battery cell by a press unit;
   measuring insulation resistance of the cell during pressing of the cell by a measurement unit; and
   determining leakage of an electrolyte in the cell on the basis of the insulation resistance by a controller configured to communicate with the measurement unit;
   wherein the pouch-type battery cell includes a sealing surface sealing a pouch of the pouch-type battery cell, wherein the sealing surface extends from at least a portion of the pouch in a first direction and includes a thickness in a second direction, wherein the press unit is configured to press a surface of the pouch along the second direction.

17. The method of claim 16, wherein when the insulation resistance is equal to or greater than a preset value, it is determined that there is no leakage of the electrolyte in the cell.

18. The method of claim 16, wherein when the insulation resistance is less than a preset value, it is determined that there is leakage of the electrolyte in the cell.

19. The method of claim 16, comprising:
   pressing the cell with a first force by the press unit based on a command from the controller;
   measuring a first insulation resistance by the measurement unit during pressing of the cell; and
   determining that there is leakage in the cell when the first insulation resistance is out of a preset allowable range.

20. The method of claim 19, comprising:
   instructing, by the controller, the press unit to press the cell with a second force greater than the first force when the first insulation resistance is within the allowable range;
   measuring, by the measurement unit, a second insulation resistance while the press unit presses the cell with the second force; and
   when the second insulation resistance is out of a preset allowable range, determining that there is leakage in the cell.

* * * * *